United States Patent [19]

Tseng

[11] Patent Number: 5,595,926
[45] Date of Patent: Jan. 21, 1997

[54] METHOD FOR FABRICATING A DRAM TRENCH CAPACITOR WITH RECESSED PILLAR

[75] Inventor: Horng-Huei Tseng, Hsin-chu, Taiwan

[73] Assignee: Industrial Technology Research Institute, Hsinchu, Taiwan

[21] Appl. No.: 267,405

[22] Filed: Jun. 29, 1994

[51] Int. Cl.$^6$ ............................ H01L 21/70; H01L 27/00
[52] U.S. Cl. ............................ 437/52; 437/203; 437/919
[58] Field of Search ................................ 437/52, 60, 919, 437/203

[56] References Cited

U.S. PATENT DOCUMENTS

| 4,650,544 | 3/1987 | Erb et al. | 156/653 |
|---|---|---|---|
| 4,859,622 | 8/1989 | Eguchi | 437/47 |
| 4,920,065 | 4/1990 | Chin et al. | 437/52 |
| 4,978,634 | 12/1990 | Shen et al. | 437/52 |
| 4,980,310 | 12/1990 | Matsuda et al. | 437/52 |
| 5,106,774 | 4/1992 | Hieda et al. | 437/52 |
| 5,204,280 | 4/1993 | Dhong et al. | 437/52 |
| 5,256,588 | 10/1993 | Witek et al. | 437/52 |

*Primary Examiner*—Jey Tsai
*Attorney, Agent, or Firm*—George O. Saile; Stephen B. Ackerman

[57] ABSTRACT

A method, and resultant structure, is described for fabricating a DRAM trench capacitor with a single pillar recessed below the level of the top surface of the silicon substrate in which it is formed. First and second insulating layers are formed over the silicon substrate, and patterned to form an opening to the silicon substrate. A portion of the silicon substrate is removed in the region defined by the opening, whereby a first trench is formed. Sidewall spacers are formed along the sides of the first trench from a third insulating layer. A first pillar is formed after depositing a first conductive layer between the sidewall spacers and over the trench and removing the first conductive layer except within the first trench. The sidewall spacers are removed. A portion of the silicon substrate in the first trench is removed that is not vertically masked by the pillar, and simultaneously a portion top of the pillar is removed, whereby a second trench and second pillar are formed at a greater depth in the silicon substrate. The remainder of the second insulating layer is also removed. A capacitor dielectric is formed in the second trench over the second pillar. A second conducting layer is formed over the dielectric layer and removed in the region outside of the trench to form the top capacitor electrode.

26 Claims, 6 Drawing Sheets

METHOD FOR FABRICATING A DRAM TRENCH CAPACITOR WITH RECESSED PILLAR

BACKGROUND OF THE INVENTION (1) Field of the Invention

This invention relates to a method of making and the resultant structure for a capacitor for use with a DRAM (Dynamic Random Access Memory) device, and more particularly to a method for producing a DRAM trench capacitor with a recessed pillar.

(2) Description of the Related Art

A typical DRAM cell consists of a single transistor and a storage capacitor. Digital information is stored in the capacitor and accessed through the transistor, by way of addressing the desired memory cell, which is connected with other such cells through an array of bit lines and word lines. In order to construct high density DRAMs in a reasonably sized chip area, both the transistor and capacitor elements must occupy a minimum of lateral space in each memory cell. As DRAMs are scaled down in dimensions, there is a continuous challenge to maintain a sufficiently high stored charge per capacitor unit area. Efforts to increase capacitance without increasing the planar area of the capacitor have been concentrated on building three dimensional capacitor structures, which increase the capacitor surface area. Thus cell structures have to change from the conventional planar-type capacitors to either trench capacitors or stack capacitors, in particular at densities above 4 Mbit.

When the stacked capacitor approach is used to fabricate 16 Mbit DRAMs and beyond, very complicated stacked structures are needed, such as fin structures, crown structures, and so forth. These typically are difficult to manufacture, and make it more difficult to form subsequent layers due to topological problems.

The trench capacitor is typically built in an opening in the substrate and thus does not effect the topology. When fabricating trench capacitors for DRAMs with densities of 16 Mbit and beyond, however, the trench needs to be very deep. There are technology and even theoretical physical limitations to processing the deep trenches that would be needed. Prior art single trenches must be 10 to 15 micrometers deep with a diameter of 0.5 micrometers. A further problem with deep trenches is that the wafer may become mechanically unstable with so many deep trenches, for in a 64 Mbit memory, for example, 64 million trenches (at one capacitor per cell) are needed.

Workers in the art are aware of these problems, and have attempted to resolve them. For example, in U.S. Pat. No. 5,204,280 (Dhong et al) a method is shown for forming multiple recessed pillars in a shallow trench in a silicon substrate. Hemispherical grain polysilicon is used as an etch mask to form the pillars. In U.S. Pat. No. 5,256,588, Witek et al describe the formation of a pillar in a trench capacitor over which the DRAM transistor is subsequently formed.

SUMMARY OF THE INVENTION

It is therefore an object of the invention to provide a method for fabricating a DRAM trench capacitor with a single pillar recessed below the level of the top surface of the silicon substrate in which it is formed.

It is a further object of the invention to provide a DRAM trench capacitor with a single pillar recessed below the silicon substrate top surface.

In accordance with the objects of this invention, there is shown a method for fabricating a capacitor with a recessed pillar in a trench, in which a silicon substrate is provided. A first insulating layer is formed over the silicon substrate. A second insulating layer is formed over the first insulating layer. The first and second insulating layers are patterned to form an opening to the silicon substrate. A portion of the silicon substrate is removed in the region defined by the opening, whereby a first trench is formed. A third insulating layer is formed, in the first trench and over the second insulating layer. Sidewall spacers are formed along the sides of the first trench by removing the third insulating layer except along the sidewalls of the trench. A first conductive layer is formed between the sidewall spacers and over the trench and the second insulating layer. The first conductive layer is removed except within the first trench between the sidewall spacers, whereby a first pillar is formed. The sidewall spacers are removed. A portion of the silicon substrate in the first trench is removed that is not vertically masked by the pillar, and simultaneously a portion of the pillar is removed, whereby a second trench and second pillar are formed at a greater depth in the silicon substrate than the first trench and the first pillar. The remainder of the second insulating layer is removed. A dielectric layer is formed in the second trench, over the second pillar, and over the first insulating layer. A second conducting layer is formed over the dielectric layer. The second conducting layer is removed in the region outside of the trench.

Further in accordance with the invention there is a structure of a capacitor with a single pillar recessed within a trench. There is a trench in a monocrystalline silicon substrate. A pillar is formed in the center of, and extending up from the bottom of, the trench, comprising an upper portion of polycrystalline silicon and a lower portion of monocrystalline silicon. There is a capacitor dielectric over the pillar and the trench. A capacitor plate is over the capacitor dielectric and within the trench.

DESCRIPTION OF THE PREFERRED EMBODIMENTS

Figure 1:
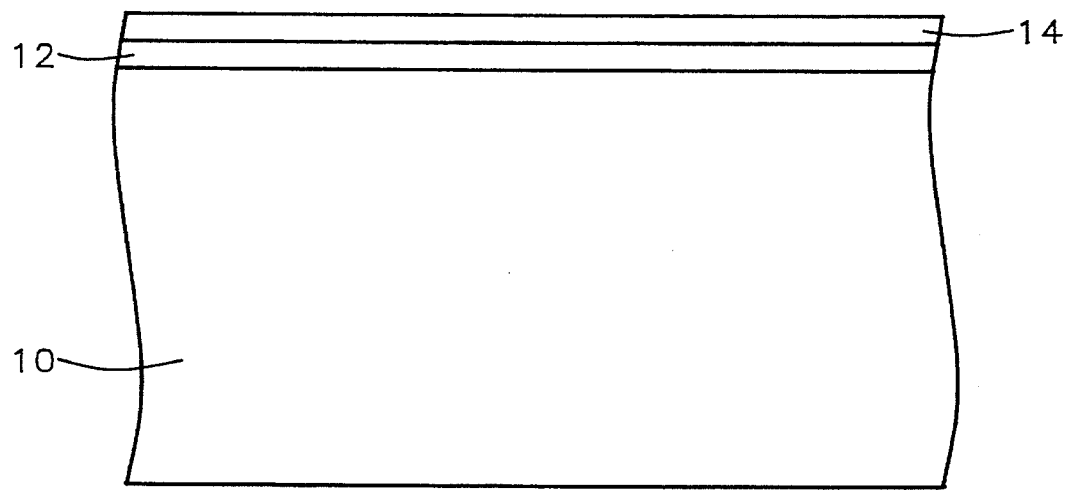
FIGS. 1 to 11 are a cross-sectional representation of a method of the invention for a DRAM trench capacitor with a single pillar recessed below the top surface of the silicon substrate in which it is formed.

The method for fabricating the DRAM trench capacitor of the invention is described in FIGS. 1 to 12. As shown in FIG. 1, a base substrate 10 of monocrystalline silicon is provided. A layer of silicon oxide ($SiO_2$) 12 is formed by thermal oxidation of the substrate, by heating to between about 950° and 1050° C. for between about 18 and 80 minutes. The resultant layer has a thickness of between about 300 and 800 Angstroms. Subsequently silicon nitride ($Si_3N_4$) 14 is deposited by LPCVD (Low Pressure Chemical Vapor Deposition) to a thickness of between about 300 and 800 Angstroms.

Figure 2:
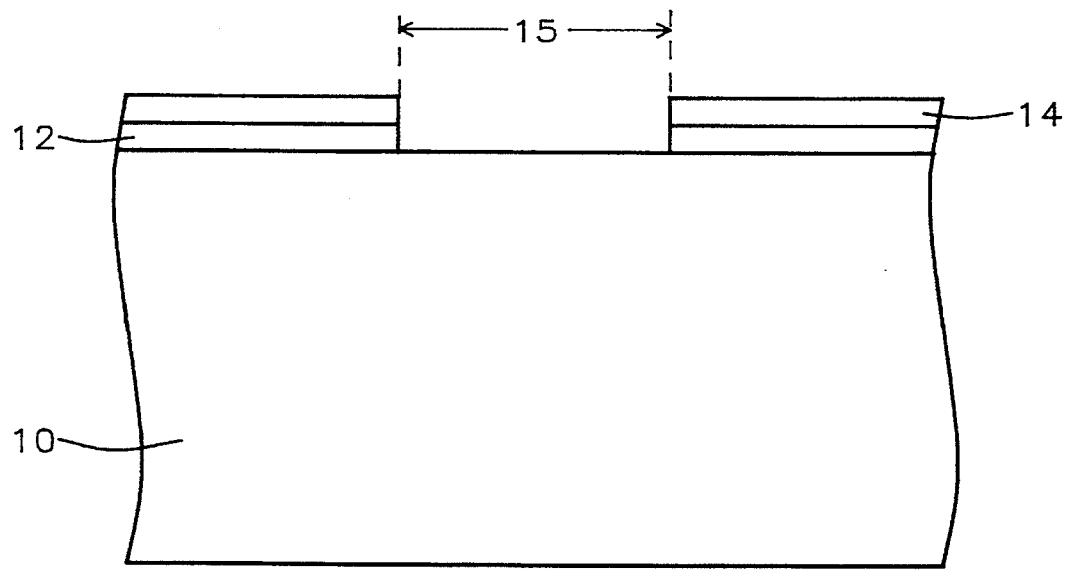

Referring now to FIG. 2, an opening is formed in oxide 12 and nitride 14 by conventional lithography, and reactive ion etching (RIE) at a pressure of about 250 mtorr, a power of about 1350 watts, and using CHF3 (trifluoromethane) at 8 sccm (standard cubic centimeters), CF4 (tetrafluoromethane) at 34 sccm and Ar (argon) at 400 sccm, on a Rainbow 4520 (Lam Research Corporation). The opening width 15 is formed to a size of between about 0.6 and 1.0 micrometers, with the minimum size determined by photolithographic constraints. This opening is formed at the desired location of the to-be-formed capacitor trench.

Figure 3:
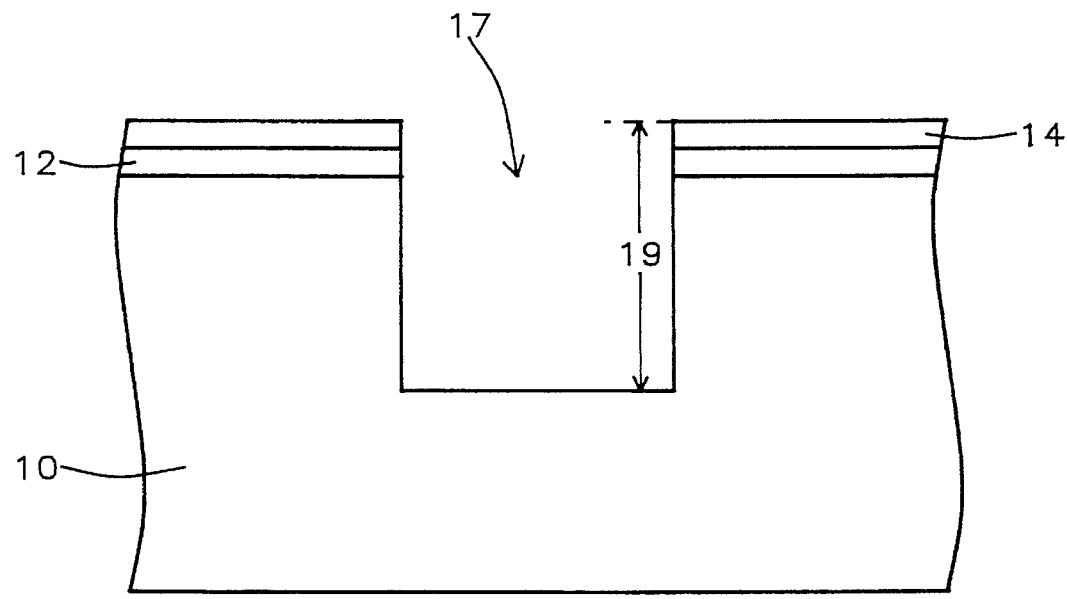

An initial trench is formed, as shown in FIG. 3, by an anisotropic etch of the silicon substrate. A reactive ion etch is performed at a pressure of about 450 mtorr, a power of about 450 watts, and using Cl2(chlorine) at 420 sccm and He (helium) at 180 sccm, on a Rainbow 4400 (Lam Research Corporation). A trench 17 is formed to a depth 19 of between about 6000 and 10,000 Angstroms.

Figure 4:
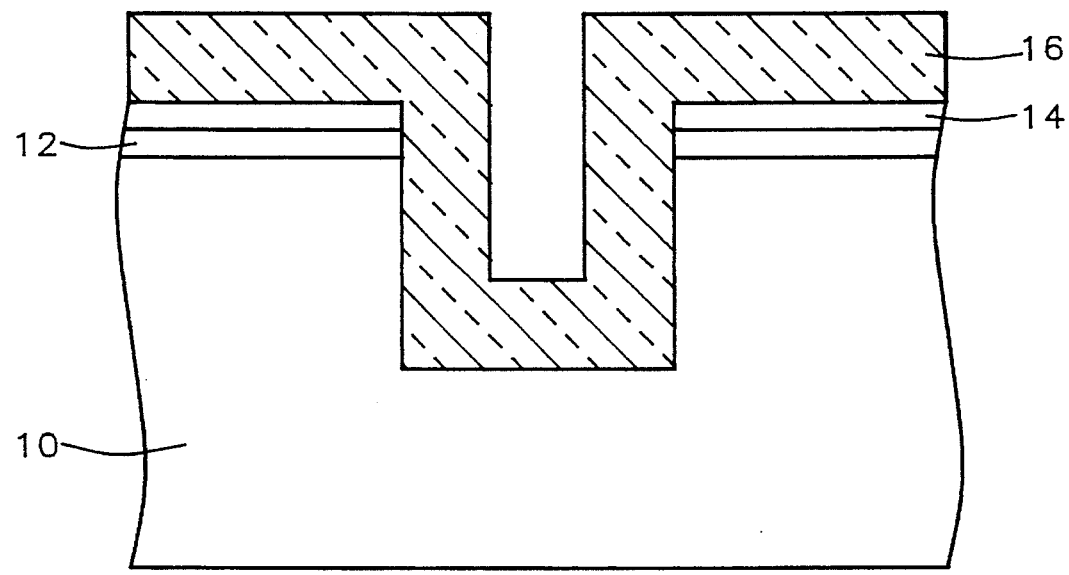
Figure 5:
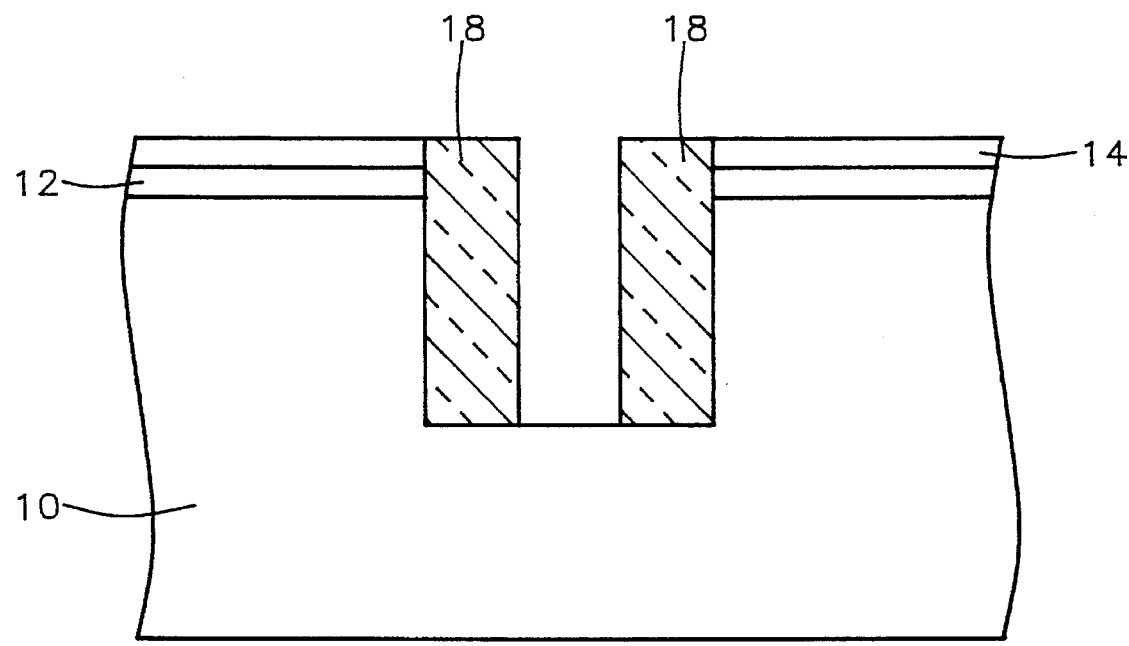

Referring now to FIG. 4, a silicon oxide (SiO2) layer 16 is deposited by CVD (Chemical Vapor Deposition) to a thickness of between about 500 and 1500 Angstroms. As shown in FIG. 5, an anisotropic etch is performed at a pressure of about 250 mtorr, a power of about 800 watts, and using CHF3 at 20 sccm, CF4 at 20 sccm and Ar at 350 sccm, on a Rainbow 4520 (Lam Research Corporation). This removes oxide from the center of the bottom of the trench, and from the region above and adjacent to the trench. Oxide sidewall spacers 18 remain on the walls of the trench and will be used to define the to-be-formed pillar.

Figure 6:
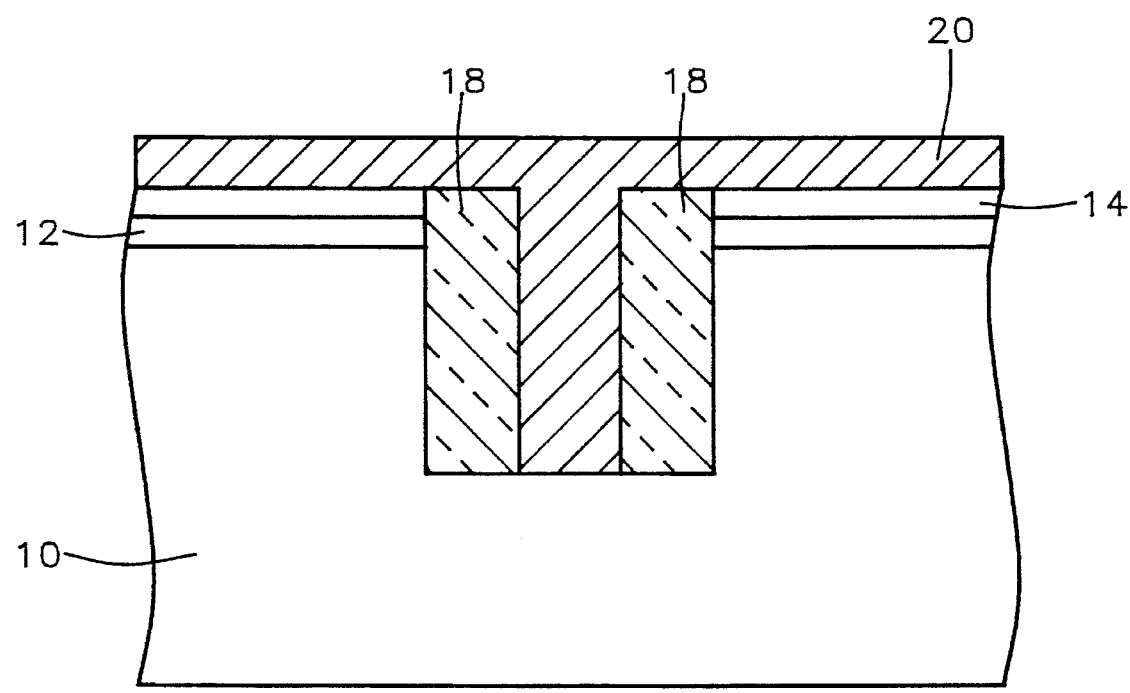
Figure 7:
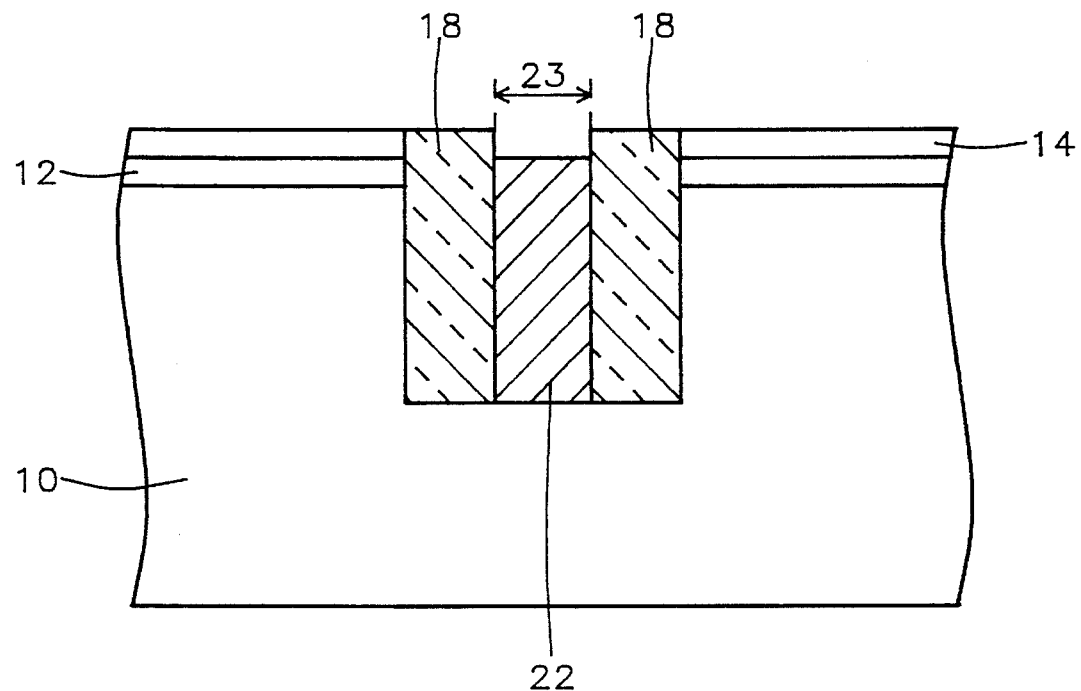

With reference to FIG. 6, polycrystalline silicon (polysilicon) 20 is deposited by LPCVD to a thickness of between about 500 and 1500 Angstroms. The polysilicon 20 could be deposited undoped or in-situ doped. In situ doping is accomplished by adding dopant gases 15% PH3 (phosphine) +85% SiH4, and 5% PH3 +95% N2 (nitrogen) during deposition, and wherein deposition is performed at a temperature of between about 550° and 600° C. As shown in FIG. 7, poly 20 is etched back by reactive ion etching at a pressure of about 300 mtorr, a power of about 450 watts, using Cl2 at 420 sccm and HBr (hydrogen bromide) at 80 sccm and He at 180 sccm, on a Rainbow 4400 (Lam Research Corporation) to form a first pillar 22. The width 23 of the pillar is between about 3000 and 5000 Angstroms, and can be varied by changing the thickness of the sidewall spacers 18, and can therefore be less than and independent of photolithographic limits.

Figure 8:
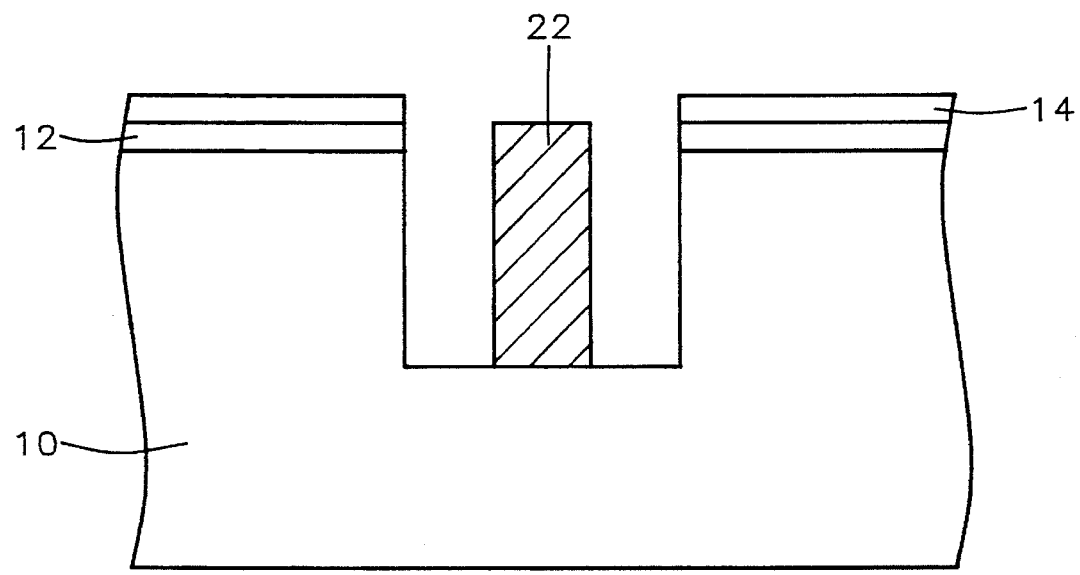

Referring now to FIG. 8, spacers 18 are removed by a wet etch in buffered hydrofluoric acid (HF). Oxide 12 is etched somewhat during this wet etch, and is undercut slightly.

Figure 9:
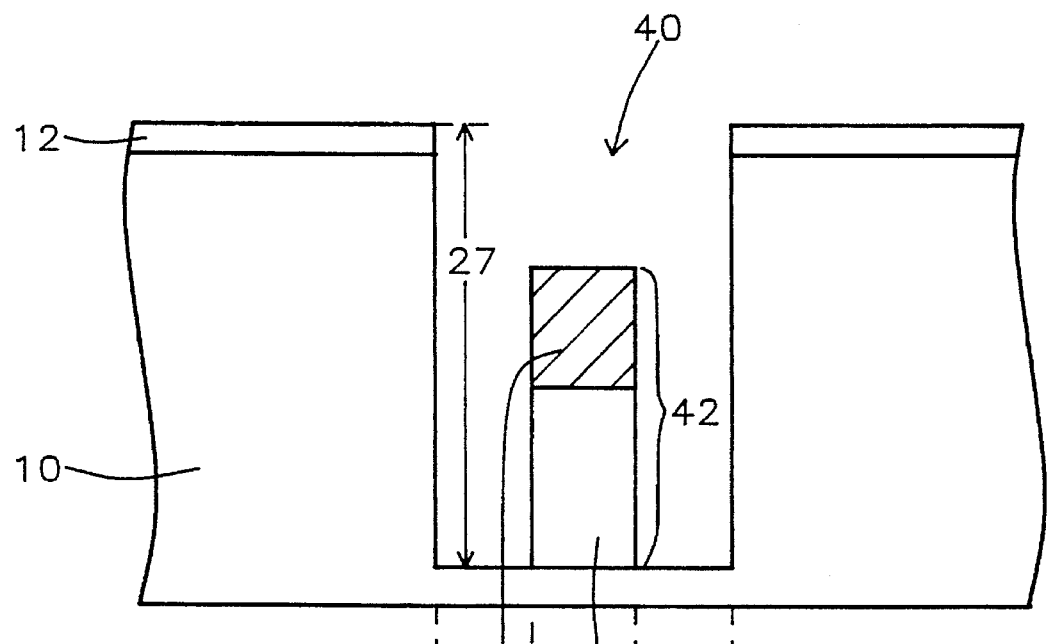
Figure 10:
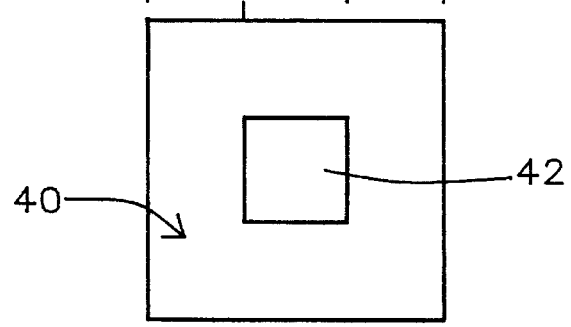

A critical step of the invention is illustrated in FIG. 9. A reactive ion etch is performed to remove a portion of polysilicon 22, and a portion of the silicon substrate at the bottom of the trench, as masked by the poly pillar. This etch is performed at a pressure of about 450 mtorr, a power of about 450 watts, and using Cl2 at 420 sccm and He at 180 sccm, on a Rainbow 4400 (Lam Research Corporation). This results in an etch rate of about 3300 Angstroms/minute, with the selectivities between the polysilicon and monocrystalline silicon about 1, between polysilicon and nitride about 1, and between polysilicon and silicon oxide of about 25 Consequently nitride layer 14 is also removed during this etch. The resultant trench 40 has a depth 27 of between about 8000 and 16,000 Angstroms. The final recessed pillar structure 42 has a height of between about 6000 and 12,000 Angstroms, and consists of polysilicon 25 and monocrystalline silicon 24. The trench pattern can be seen in the top view of FIG. 10, in which is shown pillar 42 in trench 40.

Figure 11:
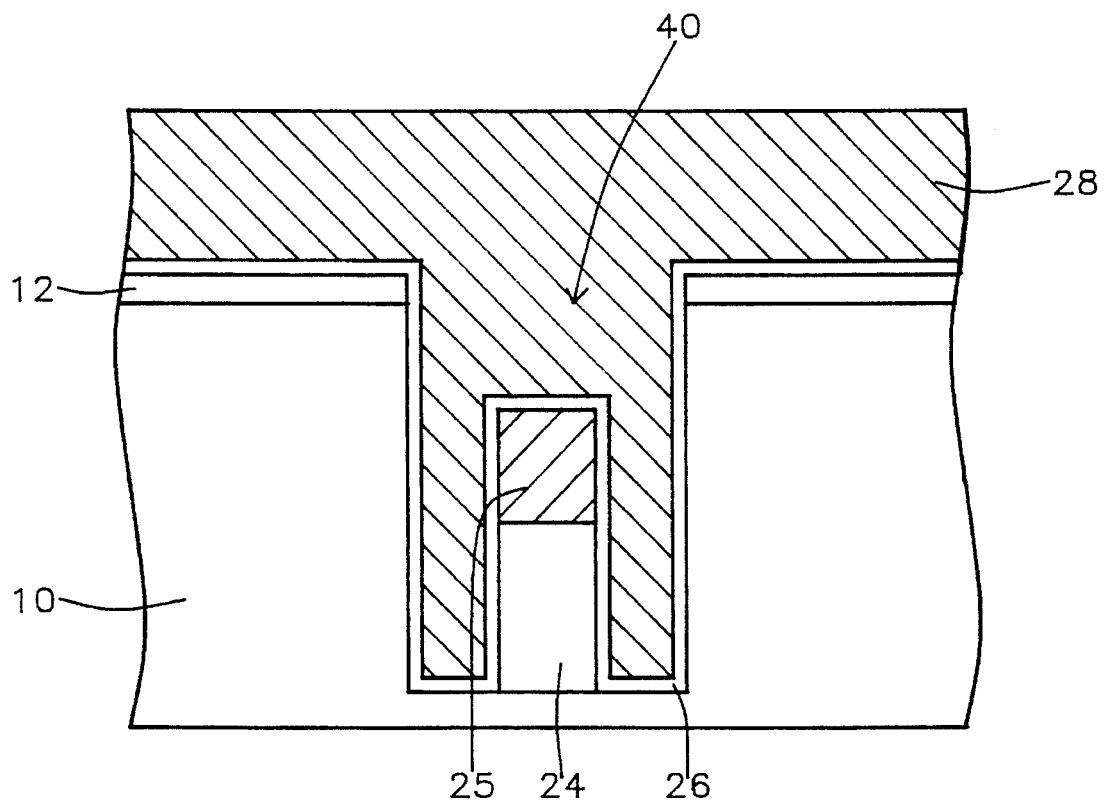

Referring now to FIG. 11, a capacitor dielectric 26 is formed over the recessed pillar and over the surface of the trench walls. This dielectric may be oxide, nitride, or combinations thereof. A composite ONO (silicon oxide - silicon nitride - silicon oxide) structure is preferred, having a thickness of between about 30 and 120 Angstroms. The bottom oxide is formed by exposure in DI (deionized) water and is formed to a thickness of between about 30 and 50 Angstroms. The middle nitride is formed by LPCVD at a temperature of about 760° C., a pressure of 350 mtorr, in NH3 (ammonia) and SiH4 (silane), to a thickness of between about 30 and 60 Angstroms. The top oxide is formed by oxidation in a dry oxygen ambient, at a temperature of 850° C. for about 30 minutes. Subsequently, a layer 28 of in-situ doped polysilicon is deposited by LPCVD to a thickness of between about 2000 and 4000 Angstroms. This layer fills trench 40 and the surface adjacent to the trench.

Figure 12:
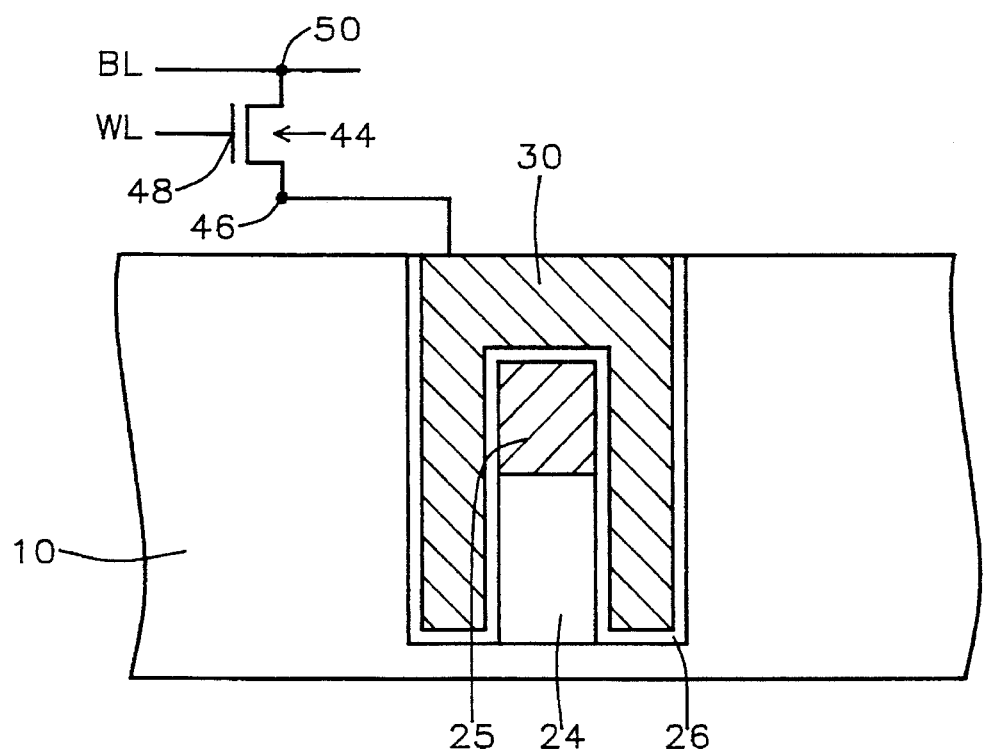
FIG. 12 is a cross-sectional representation of the last step in the method of the invention, and the resultant structure, for a DRAM trench capacitor with a single, recessed pillar, in which there is also a schematic representation of a field effect transistor connected to the capacitor of the invention, to show a complete DRAM cell.

Referring now to FIG. 12, poly layer 28 is etched back to form capacitor electrode 30. This etchback is performed using a reactive ion etch with the same conditions and equipment as the etch of polysilicon 20 described with reference to FIG. 7 above. This results in the final capacitor structure as shown in FIG. 12. For use in a DRAM cell, a single field effect transistor (FET) 44 (shown schematically in FIG. 12), or alternately a CMOS structure, would be formed and its source 46 connected to the capacitor electrode 30, wherein the FET would have a gate 48 connected to a word line (WL) of the memory array, and drain 50 connected to a bit line (BL). The formation of FET 44 is well known in the art and is not shown in detail as it is not important to the invention.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a capacitor with a single pillar recessed in a trench, comprising the steps of:

providing a silicon substrate;

forming a first insulating layer over said silicon substrate;

forming a nitride layer over said first insulating layer;

patterning said first insulating layer and said nitride layer to form an opening to said silicon substrate;

removing a portion of said silicon substrate in a region defined by said opening, whereby a first trench is formed;

forming a oxide insulating layer, in said first trench and over said nitride layer;

forming sidewall spacers along the sidewalls of said first trench by removing said oxide insulating layer except along the sidewalls of said first trench;

forming a first conductive layer between said sidewall spacers and over said first trench and said nitride layer;

removing said first conductive layer except within said first trench between said sidewall spacers, whereby a first pillar is formed;

removing said sidewall spacers;

removing a portion of said silicon substrate in said first trench that is not vertically masked by said first pillar, and simultaneously removing a portion of said first pillar, whereby a second trench and second pillar are formed at a greater depth in said silicon substrate than said first trench and said first pillar;

removing a remaining portion of said nitride layer;

forming a dielectric layer in said second trench, over said second pillar, and over said first insulating layer;

forming a second conducting layer over said dielectric layer; and removing said second conducting layer in region outside of said second trench.

2. The method of claim 1 wherein said silicon substrate is formed of single crystal silicon.

3. The method of claim 1 wherein said opening is formed to a width of between about 0.6 and 1.0 micrometers.

4. The method of claim 1 wherein said first trench is formed to a depth of between about 6000 and 10,000 Angstroms.

5. The method of claim 1 wherein said oxide insulating layer is formed of silicon oxide, to a thickness of between about 500 and 1500 Angstroms.

6. The method of claim 1 wherein said forming sidewall spacers is by an anisotropic reactive ion etch.

7. The method of claim 1 wherein said first conductive layer is formed of doped polycrystalline silicon.

8. The method of claim 1 wherein said first conductive layer is formed of undoped polycrystalline silicon.

9. The method of claim 1 wherein said removing said sidewall spacers is by a wet etch in hydrofluoric acid.

10. The method of claim 1 wherein said second pillar and said second trench are formed by an anisotropic etch.

11. The method of claim 10 wherein said anisotropic etch is performed at a pressure of about 450 mtorr, a power of about 450 watts, using C12 (chlorine) at 420 sccm and He (helium) at 180 sccm.

12. The method of claim 1 wherein said second trench has a depth of between about 8000 and 16,000 Angstroms, and said second pillar has a height of between about 6000 and 12,000 Angstroms.

13. The method of claim 1 wherein said removing the remainder of said nitride layer is accomplished simultaneously with said removing a portion of said pillar.

14. A method for fabricating a DRAM cell having a capacitor with a single pillar recessed in a trench, comprising the steps of:

providing a silicon substrate;

forming a first insulating layer over said silicon substrate;

forming a nitride layer over said first insulating layer;

patterning said first insulating layer and said nitride layer to form an opening to said silicon substrate;

removing a portion of said silicon substrate in a region defined by said opening, whereby a first trench is formed;

forming a oxide insulating layer, in said first trench and over said nitride layer;

forming sidewall spacers along the sidewalls of said first trench by removing said oxide insulating layer except along the sidewalls of said first trench;

forming a first conductive layer between said sidewall spacers and over said first trench and said nitride layer;

removing said first conductive layer except within said first trench between said sidewall spacers, whereby a first pillar is formed;

removing said sidewall spacers;

removing a portion of said silicon substrate in said first trench that is not vertically masked by said first pillar, and simultaneously removing a portion of said first pillar, whereby a second trench and second pillar are formed at a greater depth in said silicon substrate than said first trench and said first pillar;

removing a remaining portion of said nitride layer;

forming a dielectric layer in said second trench, over said second pillar, and over said first insulating layer;

forming a second conducting layer over said dielectric layer;

removing said second conducting layer in region outside of said second trench; and forming a field effect transistor in said silicon substrate, connected to one electrode of said capacitor.

15. The method of claim 14 wherein said silicon substrate is formed of single crystal silicon.

16. The method of claim 14 wherein said opening is formed to a width of between about 0.6 and 1.0 micrometers.

17. The method of claim 14 wherein said first trench is formed to a depth of between about 6000 and 10,000 Angstroms.

18. The method of claim 14 wherein said oxide insulating layer is formed of silicon oxide, to a thickness of between about 500 and 1500 Angstroms.

19. The method of claim 14 wherein said forming sidewall spacers is by an anisotropic etch.

20. The method of claim 14 wherein said first conductive layer is formed of doped polycrystalline silicon.

21. The method of claim 14 wherein said first conductive layer is formed of undoped polycrystalline silicon.

22. The method of claim 14 wherein said removing said sidewall spacers is by a wet etch in hydrofluoric acid.

23. The method of claim 14 wherein said second pillar and said second trench are formed by an anisotropic etch.

24. The method of claim 23 wherein said anisotropic etch is performed at a pressure of about 450 mtorr, a power of about 450 watts, using C12 (chlorine) at 420 sccm and He (helium) at 180 sccm.

25. The method of claim 14 wherein said second trench has a depth of between about 8000 and 16,000 Angstroms, and said second pillar has a height of between about 6000 and 12,000 Angstroms.

26. The method of claim 14 wherein said removing the remainder of said nitride layer is accomplished simultaneously with said removing a portion of said pillar.

* * * * *